United States Patent
Rietzler

(10) Patent No.: US 8,305,764 B2
(45) Date of Patent: Nov. 6, 2012

(54) METHOD AND SEMIFINISHED PRODUCT FOR PRODUCING AN INLAY

(75) Inventor: Manfred Rietzler, Marktoberdorf (DE)

(73) Assignee: Smartrac IP B.V., Amsterdam (NL)

(*) Notice: Subject to any disclaimer, the term of this patent is extended or adjusted under 35 U.S.C. 154(b) by 5 days.

(21) Appl. No.: 12/279,825

(22) PCT Filed: Nov. 23, 2007

(86) PCT No.: PCT/EP2007/010190
§ 371 (c)(1), (2), (4) Date: Aug. 18, 2008

(87) PCT Pub. No.: WO2008/101529
PCT Pub. Date: Aug. 28, 2008

(65) Prior Publication Data
US 2010/0226107 A1    Sep. 9, 2010

(30) Foreign Application Priority Data
Feb. 19, 2007 (DE) .......................... 10 2007 008 487

(51) Int. Cl.
H05K 7/00 (2006.01)
H05K 1/18 (2006.01)
H05K 1/16 (2006.01)

(52) U.S. Cl. .................... 361/760; 361/761; 361/765

(58) Field of Classification Search ........... 361/760–766
See application file for complete search history.

(56) References Cited

U.S. PATENT DOCUMENTS

| | | | | |
|---|---|---|---|---|
| 4,707,593 A | * | 11/1987 | Murata et al. | 235/487 |
| 4,746,392 A | * | 5/1988 | Hoppe | 156/244.12 |
| 5,173,840 A | * | 12/1992 | Kodai et al. | 361/737 |
| 5,261,987 A | * | 11/1993 | Luening et al. | 156/235 |
| 5,520,863 A | * | 5/1996 | Ochi et al. | 264/46.5 |
| 5,612,513 A | | 3/1997 | Tuttle et al. | |
| 5,690,773 A | | 11/1997 | Fidalgo et al. | |
| 5,849,230 A | | 12/1998 | Murohara | |
| 6,050,494 A | * | 4/2000 | Song et al. | 235/492 |
| 6,282,781 B1 | * | 9/2001 | Gotoh et al. | 29/841 |

(Continued)

FOREIGN PATENT DOCUMENTS

DE    103 24 043 A1    12/2004

(Continued)

OTHER PUBLICATIONS

Notification of Transmittal of Translation of the International Preliminary Report on Patentability (Chapter I or Chapter II of the Patent Cooperation Treaty), International Preliminary Report on Patentability, Written Opinion of the International Searching Authority, mailed Sep. 17, 2009.

(Continued)

*Primary Examiner* — Timothy Thompson
*Assistant Examiner* — Nathan Milakovich
(74) *Attorney, Agent, or Firm* — Proskauer Rose LLP

(57) ABSTRACT

The invention relates to a method and a semifinished product for producing an inlay, in particular for chip cards, stored value cards, identification documents, or the like, having at least two electronic components, all electronic components being arranged in a relative configuration on a carrier substrate to implement a component configuration and the component configuration being arranged in a filler material. Furthermore, the invention relates to a method for producing a card having a semifinished product and a card produced using the semifinished product.

20 Claims, 4 Drawing Sheets

U.S. PATENT DOCUMENTS

| | | | |
|---|---|---|---|
| 6,524,517 B1 * | 2/2003 | John et al. | 264/496 |
| 7,063,267 B2 * | 6/2006 | Tsuchimoto | 235/492 |
| 7,230,309 B2 * | 6/2007 | Bauer et al. | 257/433 |
| 7,269,021 B2 * | 9/2007 | Gundlach et al. | 361/737 |
| 7,663,214 B2 * | 2/2010 | Koh | 257/679 |
| 2004/0112967 A1 * | 6/2004 | Krappe et al. | 235/492 |
| 2008/0037232 A1 * | 2/2008 | Schroetlin | 361/760 |
| 2009/0020615 A1 * | 1/2009 | Patel | 235/492 |
| 2009/0123704 A1 * | 5/2009 | Shafran et al. | 428/167 |

FOREIGN PATENT DOCUMENTS

| | | |
|---|---|---|
| EP | 0 587 011 | 3/1994 |
| EP | 0 587 011 A1 | 3/1994 |
| EP | 1 244 055 | 9/2002 |
| EP | 1 244 055 A2 | 9/2005 |
| JP | 60-122456 | 6/1985 |
| JP | 05-246185 | 9/1993 |
| JP | 06-122297 | 5/1994 |
| JP | 08-036629 | 2/1996 |
| JP | 08-235335 | 9/1996 |

OTHER PUBLICATIONS

International Search Report for PCT/EP2007/010190 (3 pages).
Office Action from Corresponding Japanese Patent Application, Nov. 25, 2011, pp. 1 to 6.

* cited by examiner

METHOD AND SEMIFINISHED PRODUCT FOR PRODUCING AN INLAY

RELATED APPLICATIONS

This application is the U.S. National stage of International Application No. PCT/EP2007/010190, filed on Nov. 23, 2007, in German, which claims priority to German Patent Application No. 10 2007 008 487.2, filed on Feb. 19, 2007. The entire teachings of the above applications are incorporated herein by reference.

FIELD OF THE INVENTION

The invention relates to a method and a semifinished product for producing an inlay, in particular for chip cards, stored value cards, identification documents, or the like, having at least two electronic components. All electronic components are arranged in a relative configuration on a carrier substrate to implement a component configuration. The component configuration is arranged on a first cover layer. A spacer layer having a through opening is applied to the first cover layer, and the component configuration is accommodated by the through opening. A filler material is introduced which at least fills up the through opening. A second cover layer is applied to the spacer layer, and the filler material is solidified on the cover layers while implementing a pressure force. Furthermore, the invention relates to a method for producing a card using a semifinished product and a card comprising a semifinished product of this type.

BACKGROUND

Methods and semifinished products for producing an inlay of the type cited at the beginning are well-known and are regularly used for producing a precursor product of chip cards, bank cards, access control cards, passport documents, or the like. The production of inlays and/or cards of this type is typically performed by hot lamination, i.e., various plastic layers are compressed with electronic components situated interposed and are bonded to one another at a relatively high temperature. The hot lamination is often applied both for producing an inlay and also for producing a card. In the event of the integration of multiple electronic components in an inlay and/or a card, such as displays, LEDs, miniature loudspeakers, batteries, etc., the hot lamination technology has proven to be disadvantageous. The incorporated components are partially temperature-sensitive and are not resistant to the typical hot lamination temperatures, which may be up to 150° C. The electronic components may also have a complex geometry, so that it is difficult to fit these components in a layered composite having punched windows for accommodating the components.

Production methods which avoid the above-mentioned disadvantages are so-called "cold lamination", in which the electronic components are cast between two layers using a cold-curing filler material, and so-called "warm lamination", in which adhesive material is caused to cure between layers at comparatively low temperatures.

An array of production variants of these methods for producing an inlay and/or a card are thus known from the prior art. In the known methods, for example, a second positioning layer is laid as a positioning aid on one layer of a card, this second layer having recesses which correspond to the geometric shapes of electronic components to be inserted. After the components and the second layer are cast in a filler material, a third layer is applied at a defined distance which determines the thickness of the card before curing of the filler material. The positioning layer may, inter alia, comprise a porous material so that the filler material penetrates into the positioning layer. The positioning layer may also be essentially completely enclosed by the filler material and may form an element which stabilizes the card. This known method from the prior art is distinguished in that the positioning layer is compressed under pressure with the filler material interposed and the components. In certain circumstances, a pressure force which damages the components is exerted on the electronic components in this case. Precise positioning of all components within a middle layer implemented from filler material may also only be determined with difficulty in a method of this type. The components may be displaced both in the horizontal and also the vertical directions in an undesired manner by the application of filler material and/or the compression. This is especially probable and undesirable in particular if electronic components having different geometric shapes are used simultaneously, such as a coil antenna or a display.

SUMMARY OF THE INVENTION

The present invention is therefore based on the object of proposing a simple and cost-effective method and/or semifinished product for producing an inlay for a chip card, which avoids destruction of electronic components by high temperatures and pressure forces, allows the simultaneous use of electronic components having different geometric shapes, and ensures a defined relative configuration of all components in a card body.

In the first method according to the invention for producing an inlay having at least two electronic components, all electronic components are arranged in a relative configuration on a carrier substrate to implement a component configuration, and the component configuration is arranged on a first cover layer. A spacer layer having a through opening is then applied to the first cover layer, the component configuration being accommodated by the through opening, a filler material which at least fills up the through opening being introduced therein, a second cover layer being applied to the spacer layer, and the filler material being solidified on the cover layers while implementing a pressure force.

In the second method according to the invention for producing an inlay having at least one electronic component, all electronic components are arranged in a relative configuration on a carrier substrate to implement a component configuration. A spacer layer having a through opening is applied to a first cover layer, and a component configuration is then arranged on the first cover layer, the component configuration being accommodated by the through opening, a filler material at least filling up the through opening being introduced therein, a second cover layer being applied to the spacer layer, and the filler material being solidified while implementing a pressure force on the cover layers.

In both methods, a spacer layer is advantageously used, the spacer layer defining the spacing of both cover layers and thus the thickness of the card inlay. If a pressure force is exerted on the cover layers during the subsequent curing of the filler material, the pressure force may be essentially absorbed by the cover layer without the component experiencing a pressure force. Thus, components of different sizes, in particular heights, may also be introduced into the through opening of the spacer layer, the height of the components never exceeding the thickness of the spacer layer, however. Furthermore, it is ensured by arranging all electronic components on a carrier substrate that the components are not displaced from their defined relative position by the filling of the filler material or by the exertion of a pressure force. Thus, for example, the height of a display and/or its relative position to a button element is/are definable easily. The method is also simplified as a whole, because all components are arranged on the first cover layer in a single method step. The electrical connection lines of the components to one another are also not altered and/or damaged by the filling of the filler material and/or the exertion of the pressure force, so that a functional check of the component configuration is already possible before the component configuration is arranged on the first cover layer.

In one embodiment of the method, before the component configuration is arranged on the first cover layer, a first quantity of filler material may be introduced into the through opening, the electronic components may be arranged in a relative configuration in the filler material, and the filler material may be solidified to form a carrier substrate. It is thus ensured on the one hand that all components are completely enclosed by filler material, and on the other hand that all components are permanently positionable within a defined relative position in the filler material. The subsequent method steps may thus no longer influence the relative position of the components. A carrier substrate having different positioning levels for components within an inlay may also be implemented by different sequential deliveries of filler material into the through opening.

It has been proven to be especially advantageous if the solidification of the filler material is performed by a temperature impingement, the temperature not exceeding a temperature which damages components. In addition to the use of cold-curing artificial resins as the filler material, a casting material may thus be used as the filler material which may be activated and cured at a relatively low temperature, such as 80° C. Therefore, there is no damage to the components by a relatively high temperature as in hot lamination, and the curing may be performed comparatively rapidly in relation to cold-curing artificial resins because of the temperature activation.

If the component configuration is fixed on the first cover layer, slipping and/or a position change of the component configuration as a result of the supply of filler material into the through opening may advantageously be prevented.

The component configuration may be fixed easily on the first cover layer using a fixing layer which is implemented between a bottom side of the component configuration and the first cover layer. A fixing layer of this type may be entirely or partially applied to the first cover layer or the component configuration, for example, and may comprise adhesive material or an adhesive film.

In further embodiments, the fixing of the component configuration on the first cover layer may be performed using ultrasound. Thus, a connection may be produced easily between cover layer and component configuration without the use of additional materials, without the component configuration experiencing a significant temperature impingement.

The fixing of the component configuration on the first cover layer may also be performed using a thermal method. Thus, fixing may be performed by a thermal gluing method or by a method which results in softening of the surface of the first cover layer and the component configuration. It is essential here that the thermal method is locally applied, so that no undesired heating of the components occurs.

If at least one component is implemented as a display element, an optical transmission layer may be arranged between the display element and the second cover layer. An optical transmission layer allows good visibility through the second cover layer, because air intermediate spaces between display element and cover layer are avoided. The optical transmission layer may be formed by a low-viscosity adhesive material which is dispensed before a display element area is joined with the second cover layer and ensures an optimum optical transmission through the second cover layer.

If the cover layers are permanently connected to the spacer layer, the cover layers are no longer removable from the spacer layer. A permanent connection may be implemented simply as a result of a solidification of filler material which is located between cover layers and spacer layer, or by an adhesive material layer which is applied in the contact area between spacer layer and cover layers already before the filler material is introduced.

In a further advantageous embodiment of the method, the first and/or the second cover layer may be removed from the spacer layer and/or the solidified filler material before or after the inlay is isolated from a layer configuration having the cover layers and the spacer layer. This may be implemented easily in that materials are used for the cover layers which bond poorly to the filler material, such as PET having an overall glossy and/or smooth surface. The implementation of an inlay which only has a spacer layer is advantageous in particular if the inlay is to be implemented as relatively thin or if cover layers interfere in the overall card composite.

It has proven to be especially advantageous if the inlay is isolated from the layer configuration in such a manner that a partition line runs between an internal contour of the through opening and an external contour of the component configuration. The spacer layer is thus not also isolated corresponding to the course of the partition line. The inlay usable to implement a card thus does not have a spacer layer and/or positioning layer. The electronic components are solely accommodated in a layer composite of filler material and two external cover layers. By using the spacer layer, positioning of the component configuration within a contour of the inlay determined by the partition line is nonetheless advantageously made possible.

In the semifinished product according to the invention for producing an inlay having at least two electronic components, all electronic components are arranged in a relative configuration on a carrier substrate to implement a component configuration, and the component configuration is accommodated by a through opening of a spacer layer, the through opening being filled up by a solidified filler material. The semifinished product may thus be produced especially cost-effectively, because all electronic components are insertable into the through opening in one work step. A permanent connection between carrier substrate and first cover layer may also thus be produced easily. In particular, it may be ensured that all components are arranged permanently in the provided relative configuration, because the latter is not changed even by the filling of the filler material.

It is advantageous if the spacer layer having the through opening is applied to a first cover layer, the component configuration being arranged on the first cover layer. The semifinished product is thus producible especially easily.

If a partition line runs between an internal contour of the through opening and an external contour of the component configuration, an inlay may be isolated from the semifinished product which has no spacer layer and/or positioning layer influencing the properties of the inlay.

In a further embodiment, a surface structure may be implemented on a contact side of the carrier substrate facing toward the first cover layer. A surface structure, for example, in the form of webs, waves, nubs, etc., allows the penetration of filler material below the carrier substrate, i.e., into the area between carrier substrate and the first cover layer, so that the formation of air inclusions below the carrier substrate upon casting with filler material is avoided.

If at least one cover layer of the semifinished product is optically transparent, an electronic component implemented as a display element may be observed and/or read. For example, if a display screen is used as the display element, it is advantageous if all layers covering the display screen are optically transparent.

In an especially advantageous embodiment, the semifinished product is formed from a panel sheet, which has at least one further component configuration, one through opening, and one solidified filler material. Overall, a plurality of inlays may thus be obtained from one semifinished product of this type and may be produced especially economically.

In the method according to the invention for producing a card having a semifinished product, at least one external layer is bonded to the semifinished product and/or the inlay using an adhesive bond before or after a card and/or an inlay is/are isolated from a layer configuration, the card and/or the inlay being isolated from the layer configuration in such a manner that a partition line runs between an internal contour of a through opening of a spacer layer and an external contour of a component configuration arranged in the through opening. By using an adhesive material for bonding the semifinished product to an external layer before the card is isolated or after the inlay is isolated with an external layer from the layer configuration, it is not necessary to apply a bonding method which may damage the electronic components by excessive temperatures.

To implement especially thin cards or cards in which the cover layers would interfere, it has proven to be especially advantageous if the first and/or the second cover layer is/are removed from the spacer layer and/or a solidified filler material before an application of the external layer.

In an advantageous embodiment of the method, the adhesive bond may be activated by temperature impingement, the temperature not exceeding a temperature which damages components. A temperature-activated adhesive bond allows rapid and tight implementation of a layer composite at comparatively low temperatures. The adhesive material may be applied to both the external layers and also to the semifinished product and/or the inlay. For example, in a special embodiment, a lamination may be performed as so-called warm lamination having lowered lamination temperature. The corresponding lamination adhesives may already be activated at relatively low temperatures.

The card according to the invention has a layer configuration encompassing the semifinished product having at least one printable external layer, the external layer being printable before or after application onto the card.

If the card has a display element, it is especially advantageous if the external layer is optically transparent at least in a partial area. Thus, for example, a display screen may be at least regionally visible through an area of the external layer which is approximately adapted to the size of the display screen.

Damage to a printing is advantageously avoidable if the external layer is completely transparent and is printed on a side facing toward the filler material.

BRIEF DESCRIPTION OF THE DRAWINGS

The invention is explained in greater detail hereafter with reference to the appended drawings.

FIG. 8 shows a top view of a panel sheet in section along a line VIII-VIII from FIG. 2a.

DETAILED DESCRIPTION

Figure 1:
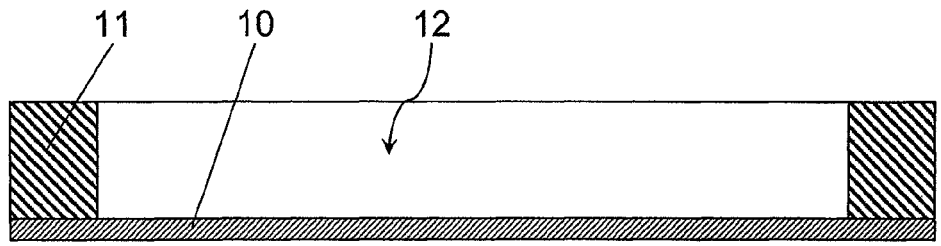
FIG. 1 shows a first cover layer having a spacer layer in a sectional view after a first method step.

One embodiment of a method for producing an inlay is shown in FIGS. 1 through 5 in a sequence of method steps in a sectional view in each case. Thus, FIG. 1 shows a first cover layer 10 and a spacer layer 11 applied thereto having a through opening 12. The spacer layer 11 is laid on the first cover layer 10 and is permanently bonded to the first cover layer 10 using an adhesive bond (not shown in greater detail). A component configuration is then arranged in the through opening 12.

Figure 2A:
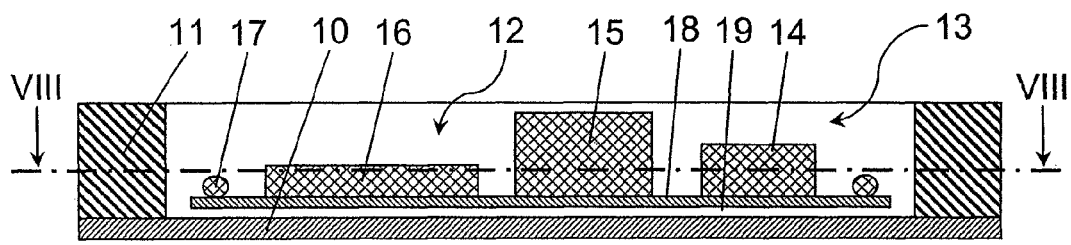
FIGS. 2a through 2d show a component configuration in various embodiments of a configuration of the component configuration on the first cover layer in a sectional view along a line II-II from FIG. 8 after a second method step.
Figure 8:
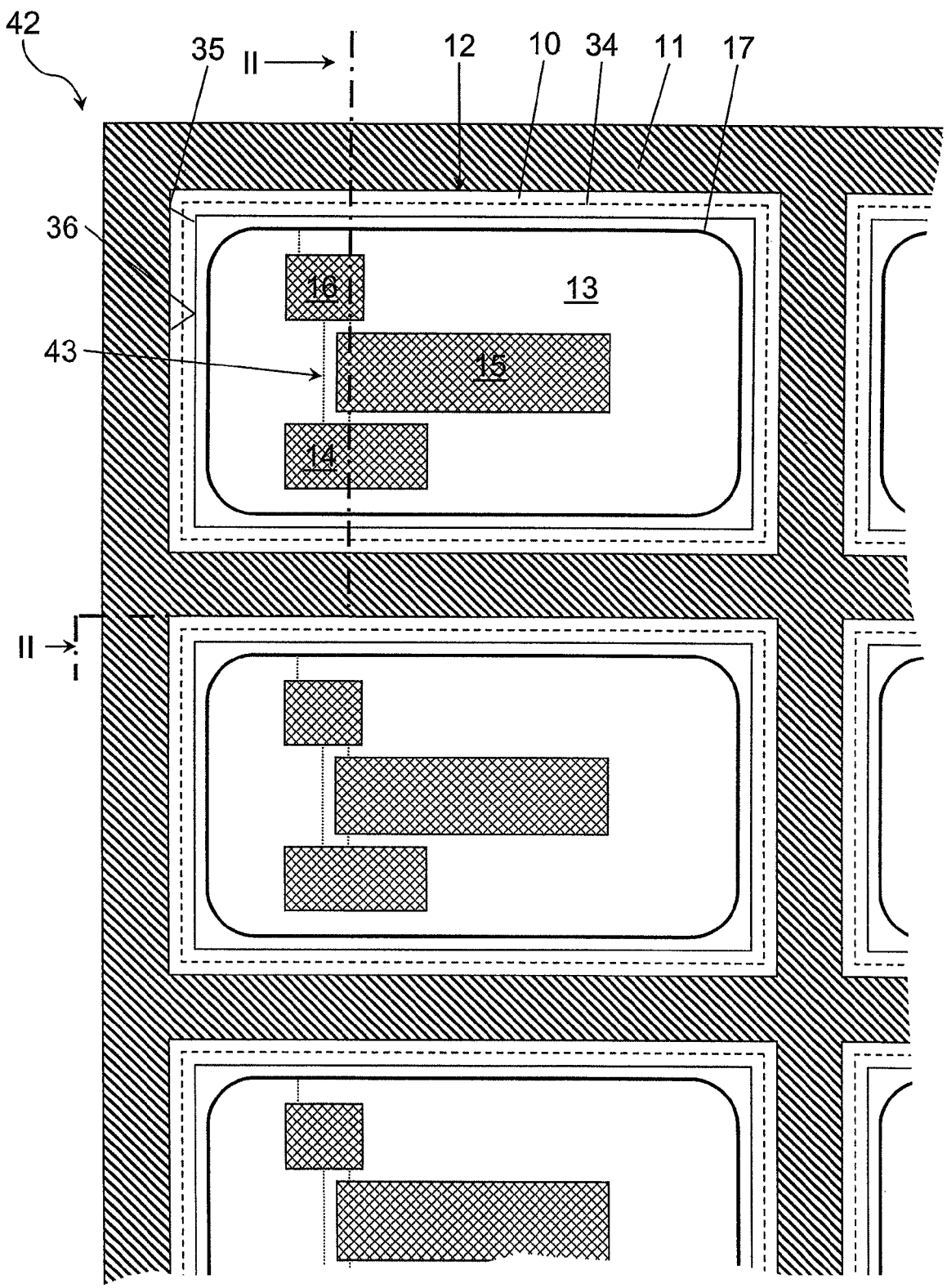

FIGS. 2a through 2d show various embodiments of an arrangement of a component configuration in a sectional view along a line II-II from FIG. 8. A component configuration 13 shown in FIG. 2a has electronic components 14, 15, 16 and an antenna winding as a component 17. The components 14, 15, 16, 17 are arranged on a carrier substrate 18 and are permanently connected thereto. The component configuration 13 thus formed is, as shown in FIG. 2a, inserted into the through opening 12, none of the components 14, 15, 16, 17 projecting above the spacer layer 11. In the embodiment shown here, a permanent connection is not formed between the carrier substrate 18 and the first cover layer 10, so that a relatively thin gap 19 may form between the carrier substrate 18 and the first cover layer 10.

Figure 2B:
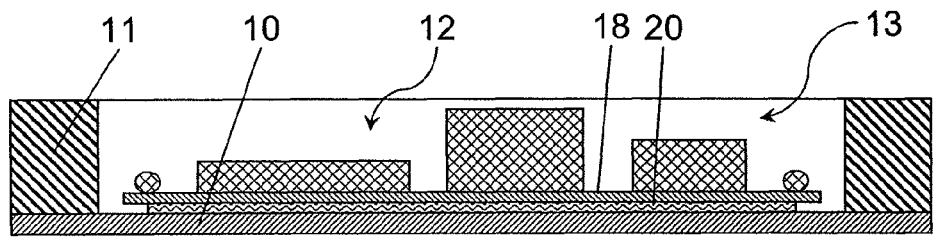

FIG. 2b shows a second embodiment of an arrangement of the component configuration 13 in the through opening 12. A fixing layer is implemented as an adhesive material layer 20 lying between the first cover layer 10 and the carrier substrate 18. The adhesive material layer 20 may, as not shown in greater detail here, be applied as an adhesive film or liquid adhesive material to the carrier substrate 18 or the first cover layer 10 before the component configuration 13 is arranged on the first cover layer 10. The adhesive material layer 20 secures the relative position of the component configuration 13 in the through opening 12 and/or on the first cover layer 10, so that slipping of the component configuration 13 and/or all components 14, 15, 16, 17 during the subsequent method steps is avoided.

Figure 2C:
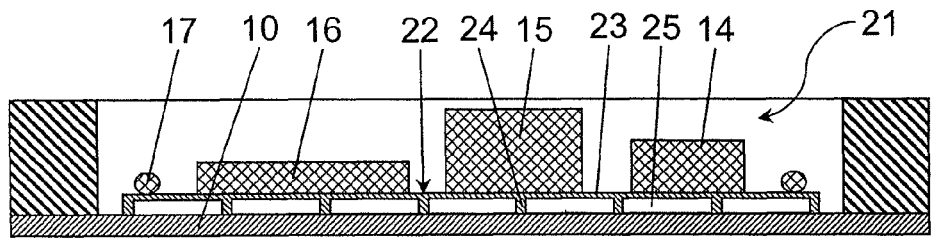

FIG. 2c shows a component configuration 21 which differs from the component configuration 13 due to a carrier substrate 22. The carrier substrate 22 is implemented from a plate-shaped carrier 23 for accommodating the components 14, 15, 16, 17 and webs 24. Thus, only the webs 24 come into contact with the first cover layer 10, and intermediate spaces 25 are implemented between the webs 24, the carrier 23, and the first cover layer 10. The intermediate spaces 25 may be filled up well by the filler material upon a subsequent casting with filler material, so that an implementation of air inclusions below the carrier substrate 22 is avoided as much as possible.

Figure 2D:
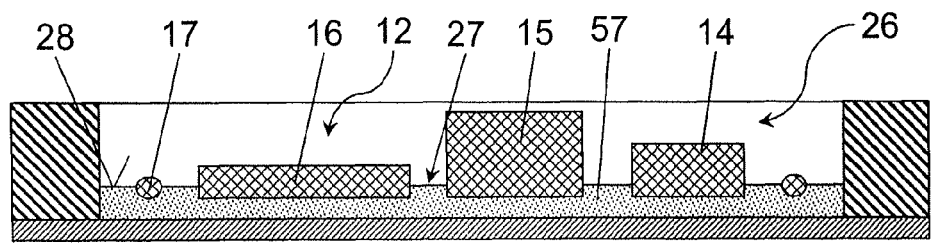

A component configuration 26 having components 14, 15, 16, 17 which are arranged on a carrier substrate 27 is shown in FIG. 2d. A defined quantity of filler material 57 is first introduced into the through opening 12 here. The components 14, 15, 16, 17 are then arranged on the surface 28 of the filler material 57 in a defined relative position, as shown, the components 14, 15, 16, 17 being able to penetrate into the surface 28 of the filler material 57 because of an exerted light pressure force. Before a further delivery of filler material is introduced into the through opening 12, the filler material 57 is solidified on the carrier substrate 27. In embodiments not shown here, the filler material 57 may also be solidified entirely or partially on the carrier substrate 27 before the components 14, 15, 16, 17 are arranged.

Figure 3:
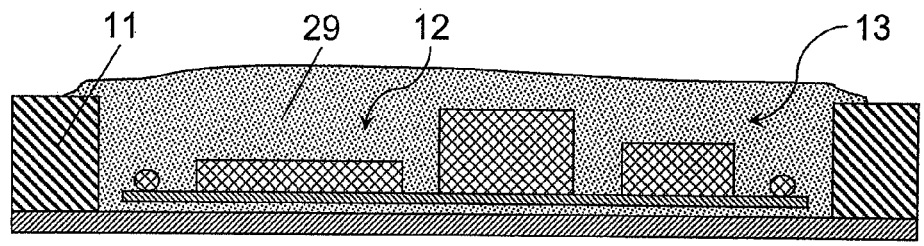
FIG. 3 shows filler material introduced into a through opening in a sectional view after a third method step.

After the component configuration 13 is arranged in the through opening 12, the through opening 12 is filled up with filler material 29, which essentially encloses the component configuration 13, as shown in FIG. 3. The quantity of filler material 29 is dimensioned in such a manner that the through opening 12 and/or the spacer layer 11 has/have filler material 29 projecting slightly above it.

Figure 4:
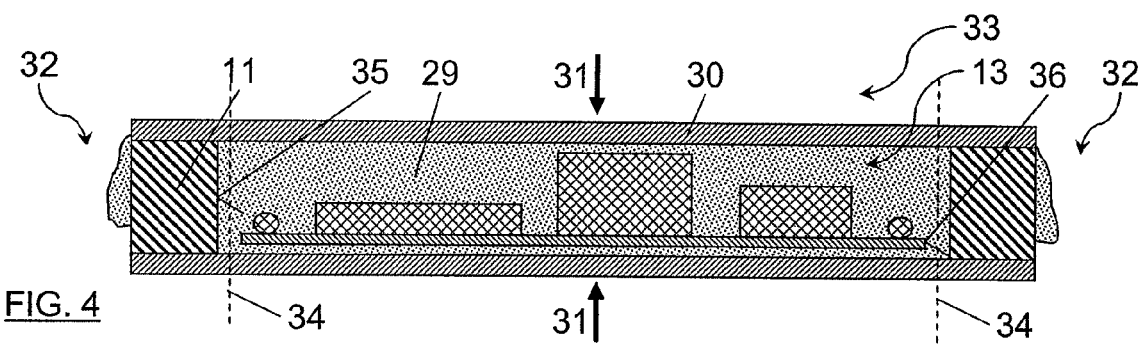
FIG. 4 shows a second cover layer applied to the spacer layer after a fourth method step.
Figure 5:
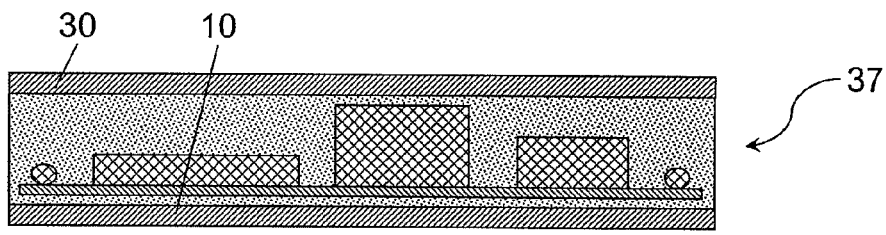
FIG. 5 shows a first embodiment of an inlay in a sectional view after a fifth method step.

In the following work steps indicated in FIG. 4, a second cover layer 30 is applied to the spacer layer 11 and the filler material 29. Furthermore, a flatly acting pressure force indicated by the arrows 31 is exerted on the first cover layer 10 and the second cover layer 30, so that excess filler material 29 between the spacer layer 11 and the second cover layer 30 exits in the edge areas 32 of the layers. In an embodiment of the method not shown in greater detail here, the second cover layer 30 may be applied at an angle to the spacer layer 11 starting from an outside edge, so that it is easier for filler material 29 to exit. If the first and second cover layers 10 and 30 are brought solidly into contact with the spacer layer 11, the filler material 29 is solidified by a temperature impingement and a semifinished product 33 is implemented. An inlay 37 as shown in FIG. 5 is then isolated from the semifinished product 33 along a peripheral partition line 34 which lies between an internal contour 35 of the through opening 12 and an external contour 36 of the component configuration 13.

Figure 6:
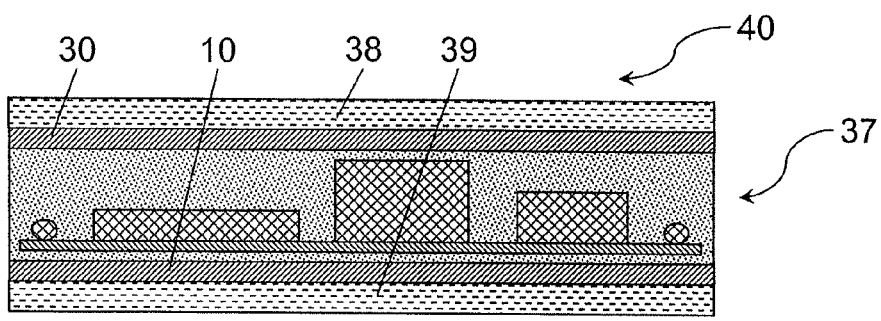
FIG. 6 shows a card in a sectional view after a sixth method step.

The inlay 37 is processed further with external layers 38, 39 to form the card 40 shown in FIG. 6. The external layers 38, 39 are preferably permanently bonded using an adhesive bond, which is not shown in greater detail here, to the cover layers 10 and 30 of the inlay 37. The adhesive material used is preferably activatable and/or curable at a relatively low temperature.

Figure 7:
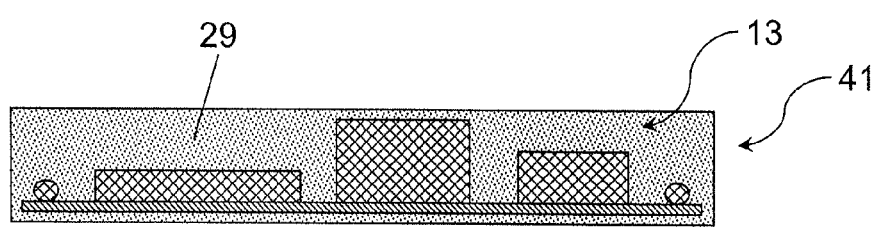
FIG. 7 shows a second embodiment of an inlay in a sectional view.

A further embodiment of an inlay 41 is shown in FIG. 7, the inlay 41 only being formed by the component configuration 13 and the solidified filler material 29. Before or after the inlay 41 is isolated from a layer configuration, the cover layers (no longer visible here) were removed from the solidified filler material 29.

FIG. 8 shows a top view in section along a line VIII-VIII from FIG. 2a with a partial detail of a panel sheet 42. The panel sheet 42 is implemented from the first cover layer 10 and the spacer layer 11 having a plurality of through openings 12. The component configuration 13 having the components 14, 15, 16, 17 shown in FIG. 2a is inserted into each through opening 12. The components 14, 15, 16, 17 are connected to one another using connection conductors 43, which are indicated as dashed lines here. The partition line 34 runs, as already noted in FIG. 4, between the internal contour 35 of the spacer layer 11 and the external contour 36 of the component configuration 13.

Figure 9A:
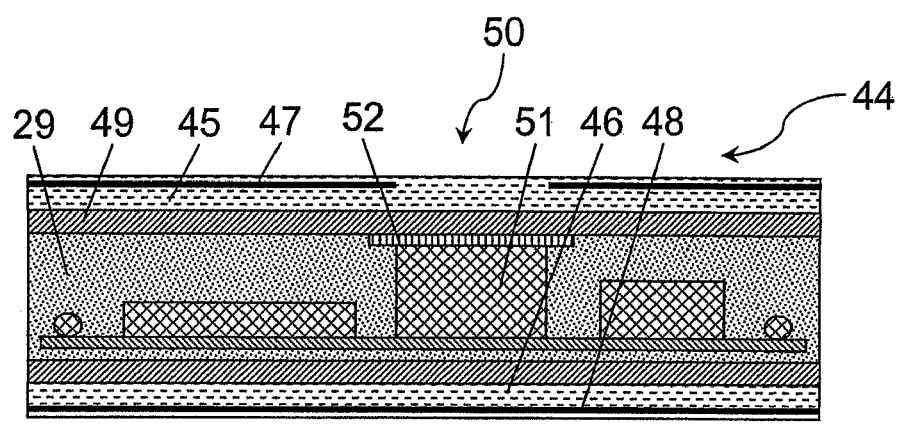
FIGS. 9a and 9b show a first and a second embodiment of a card having a display element in a sectional view.

FIG. 9a shows a card 44 having printed external layers 45 and 46. The external layers 45 and 46 are each provided on the outside with a printing 47 or 48, which is schematically indicated here. Both the external layer 45 and also a second cover layer 49 are optically transparent, and a viewing area 50 is provided in the external layer 45, in which no printing 47 is applied. An optical transmission layer 52 is arranged between a component implemented as a display element 51 and the second cover layer 49. The optical transmission layer 52 is formed from a low-viscosity adhesive material which is applied to the display element 51 before the second cover layer 49 is applied to a spacer layer (not shown here) and the filler material 29. The transmission layer 52 thus ensures a good optical transmission of visible information shown by the display element 51 through the layers 49 and 45, the display element 51 not coming directly into contact with the second cover layer 49 and possible parallelism deviations between the display element 51 and the second cover layer 49 thus being compensated for by the transmission layer 52.

Figure 9B:
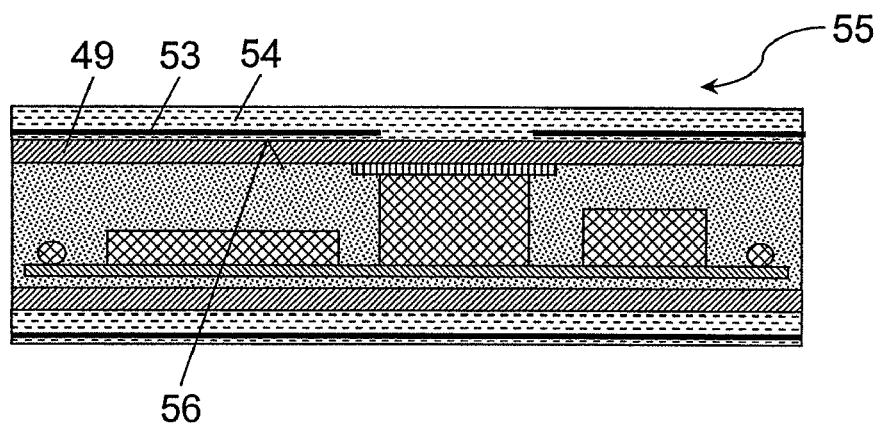

A printing 53 on a second external layer 54 before connection of the second external layer 54 to the second cover layer 49 is also possible. As shown in FIG. 9b, a card 55 may then be implemented, in which the printing 53 is applied to an interior side 56 of the second external layer 54.

The invention claimed is:

1. A method for producing an inlay having at least two electronic components comprising:
    arranging the at least two electronic components supported on a carrier substrate to implement a component configuration;
    arranging the component configuration on a first cover layer, wherein the component configuration is implemented prior to arranging the component configuration on the first cover layer;
    fixing the component configuration on the first cover layer;
    applying a spacer layer having a through opening to the first cover layer, the component configuration being accommodated by the through opening;
    introducing a filler material which at least partially fills up the through opening;
    applying a second cover layer to the spacer layer; and
    solidifying the filler material while implementing a pressure force on the first and second cover layers.

2. The method according to claim 1 further comprising solidifying the filler material by temperature impingement, the temperature not exceeding a temperature which damages components.

3. The method according to claim 1 further comprising fixing the component configuration on the first cover layer by applying a fixing layer between a bottom side of the component configuration and the first cover layer.

4. The method according to claim 1 further comprising fixing the component configuration on the first cover layer using ultrasound.

5. The method according to claim 1 further comprising fixing the component configuration on the first cover layer using a thermal method.

6. The method according to claim 1 further comprising:
    implementing at least one component as a display element; and
    arranging an optical transmission layer between the display element and the second cover layer.

7. The method according to claim 1 further comprising permanently bonding the first and second cover layers to the spacer layer.

8. The method according to claim 1 further comprising removing at least one of the first cover layer or the second cover layer from the spacer layer or the solidified filler.

9. The method according to claim 1 further comprising isolating the inlay from a layer configuration defined within a partition line extending between an internal contour of the through opening and an external contour of the component configuration.

10. A semifinished product for producing an inlay having at least two electronic components comprising:
    a first cover layer;
    a component configuration that comprises the at least two electronic components arranged and supported on a carrier substrate, the component configuration being arranged on the first cover layer, wherein the component configuration is implemented prior to arranging and then fixing the component configuration on the first cover layer;
    a spacer layer having a through opening being applied to the first cover layer, the component configuration being accommodated by the through opening of the spacer layer, and the through opening being filled up by a solidified filler material.

11. The semifinished product according to claim 10 wherein the inlay comprises a layer configuration defined within a partition line extending between an internal contour of the through opening and an external contour of the component configuration.

12. The semifinished product according to claim 10 further comprising a surface structure implemented on a contact side of the carrier substrate facing toward the first cover layer.

13. The semifinished product according to claim 10 further comprising at least one cover layer being optically transparent.

14. The semifinished product according to claim 10 wherein the semifinished product is formed from a panel sheet, which has at least one further component configuration through opening, and solidified filler material.

15. A method for producing a card using the semifinished product according to claim 10 comprising:
    bonding at least one external layer to the semifinished product using an adhesive bond;
    isolating the card or an inlay from a layer configuration defined within a partition line extending between an internal contour of the through opening of the spacer layer and the external contour of the component configuration arranged in the through opening.

16. The method according to claim 15 further comprising removing at least one of a first cover layer or a second cover layer from at least one of the spacer layer or the solidified filler material before the at least one external layer is applied.

17. The method according to claim 15 further comprising activating the adhesive bond by temperature impingement, the temperature not exceeding a temperature which damages components.

18. A card comprising the semifinished product according to claim 10 comprising at least one printable external layer applied to a layer configuration comprising the semifinished product.

19. The card according to claim 18, wherein the at least one printable external layer is optically transparent at least in a partial area.

20. The card according to claim 19, wherein the at least one printable external layer is printed on a side facing toward the filler material.

* * * * *